United States Patent
Narushima et al.

(10) Patent No.: US 8,535,439 B2
(45) Date of Patent: Sep. 17, 2013

(54) MANUFACTURING METHOD FOR SILICON SINGLE CRYSTAL

(75) Inventors: Yasuhito Narushima, Nagasaki (JP); Toshimichi Kubota, Nagasaki (JP); Shinichi Kawazoe, Nagasaki (JP); Fukuo Ogawa, Nagasaki (JP); Tomohiro Fukuda, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 924 days.

(21) Appl. No.: 12/684,284

(22) Filed: Jan. 8, 2010

(65) Prior Publication Data

US 2010/0175612 A1 Jul. 15, 2010

(30) Foreign Application Priority Data

Jan. 14, 2009 (JP) ................. 2009-005919
Jan. 14, 2009 (JP) ................. 2009-005920
Jan. 16, 2009 (JP) ................. 2009-007194

(51) Int. Cl.
*C30B 15/02* (2006.01)
(52) U.S. Cl.
USPC ............... 117/13; 117/15; 117/18; 117/19; 117/20; 117/932
(58) Field of Classification Search
USPC .................. 117/13, 15, 18, 19, 20, 932
See application file for complete search history.

(56) References Cited

U.S. PATENT DOCUMENTS

| 6,312,517 B1 | 11/2001 | Banan et al. |
| 6,899,760 B2 | 5/2005 | Choi et al. |
| 2009/0084308 A1 | 4/2009 | Kishi et al. |

FOREIGN PATENT DOCUMENTS

| JP | 59-088394 | 5/1984 |
| JP | 59-190292 | 10/1984 |
| JP | 61-163188 | 7/1986 |
| JP | 1-102160 U | 7/1989 |
| JP | 3-295891 | 12/1991 |
| JP | 8-295591 | 11/1996 |
| JP | 8-310891 | 11/1996 |
| JP | 9-208368 | 8/1997 |
| JP | 9-227275 | 9/1997 |
| JP | 9-263492 | 10/1997 |
| JP | 2001-342094 | 12/2001 |
| JP | 2003-532611 | 11/2003 |
| JP | 2003-532613 | 11/2003 |
| JP | 2004-137140 | 5/2004 |

(Continued)

OTHER PUBLICATIONS

Japan Office action, mail date is Oct. 30, 2012.

(Continued)

*Primary Examiner* — Bob M Kunemund
(74) *Attorney, Agent, or Firm* — Greenblum & Bernstein, P.L.C.

(57) ABSTRACT

To provide a manufacturing method for a silicon single crystal that can reduce introduction of dislocation thereinto even if a required amount of dopant is added to a melt while growing a straight body portion of a silicon ingot. In a manufacturing method for a silicon single crystal according to the present invention that includes a dopant addition step of adding a dopant to a melt while a straight body portion of a silicon single crystal is growing in a growth step of growing the silicon single crystal by dipping a seed crystal into a silicon melt and then pulling the seed crystal therefrom, in the dopant addition step, a remaining mass of the melt is calculated at the beginning thereof, and the dopant is added to the melt at a rate of 0.01 to 0.035 g/min·kg per minute per 1 kg of the calculated remaining mass of the melt.

30 Claims, 7 Drawing Sheets

(56) References Cited

FOREIGN PATENT DOCUMENTS

| JP | 2005-247671 | 9/2005 |
| JP | 2005-336020 | 12/2005 |
| JP | 2008-24547 | 2/2008 |
| JP | 2008-087981 | 4/2008 |
| JP | 2008-266093 | 11/2008 |
| JP | 2008-266094 | 11/2008 |

OTHER PUBLICATIONS

U.S. Office action for U.S. Appl. No. 12/597,116, mail date is Dec. 20, 2012.

MANUFACTURING METHOD FOR SILICON SINGLE CRYSTAL

This application is based on and claims the benefit of priority from Japanese Patent Application Nos. 2009-005919, 2009-005920 and 2009-007194, respectively filed on 14 Jan. 2009, 14 Jan. 2009, and 16 Jan. 2009, the contents of which are entirely incorporated herein by reference.

BACKGROUND OF THE INVENTION

1. Field of the Invention

The present invention relates to a manufacturing method for a silicon single crystal, which grows a silicon single crystal by dipping a seed crystal into a silicon melt and then pulling the seed crystal therefrom. More particularly, the present invention relates to a manufacturing method for a silicon single crystal including a step of adding a dopant to the silicon melt while a straight body portion of the silicon single crystal is growing.

2. Related Art

The Czochralski method (CZ method) is a method that grows a silicon single crystal by dipping a seed crystal into a silicon melt and then pulling the seed crystal therefrom. In the CZ method, a dopant may be added to a melt while growing a silicon single crystal by pulling, for providing the silicon single crystal with the required electrical properties.

As a method for adding a dopant to a melt while pulling a single crystal, a method of disposing an open end of a supply unit of dopant above the melt and blowing carrier gas containing the dopant from the supply unit onto the melt is known. Inert gas such as argon gas is used as the carrier gas.

In addition, an invention of pulling and growing a silicon single crystal ingot having different resistivity discontinuously in a growing direction of the silicon single crystal, by: disposing a sample tube (doping tube) at a position not interfering with a pulling mechanism; lowering the sample tube down to just above an upper face of a crucible; melting a dopant inside the sample tube by radiant heat from the melt at the position; and then lowering the sample tube containing the dopant to a position so as to be immersed in the melt and thereby adding the melted dopant to the melt from an open surface of the sample tube, is disclosed in Japanese Unexamined Patent Application Publication No. 2005-336020.

Furthermore, an invention that supplies a dopant to a melt such that there is little or no concentration of dopant in a melt until a first half of a straight body portion of a silicon single crystal is formed and there is high concentration of dopant in the melt after that the first half of the silicon single crystal is formed, is disclosed in Japanese Unexamined Patent Application Publication No. 2008-266093. Here, a method of spraying a vapor, obtained by subliming a sublimable dopant, onto the melt is disclosed as a method for adding the dopant to the melt.

According to the prior arts disclosed in Japanese Unexamined Patent Application Publications No. 2005-336020 and 2008-266093, a silicon single crystal having desired electrical properties can be obtained since the concentration of the dopant in the melt can be changed while growing the silicon single crystal. In recent years, there has been a strong need for a silicon single crystal of low resistivity containing a high concentration of dopant. In order to obtain such a silicon single crystal, a large amount of dopant must be added while growing the silicon single crystal. Here, as disclosed in Japanese Unexamined Patent Application Publication No. 2008-266093, it is known that a dopant should be added while growing a straight body portion of a silicon single crystal because a high concentration of dopant in the melt in growing of a shoulder portion to the straight body portion may lead to breakage of the single crystal.

However, the present inventors found that, by adding a large amount of dopant to a melt while growing a single crystal, a dislocation is introduced into the growing single crystal even while growing the straight body portion of the silicon single crystal. If a dislocation is introduced into a silicon single crystal, the silicon wafer obtained from the single crystal is inappropriate for manufacturing a semiconductor device, thus lowering yield of the silicon single crystal.

SUMMARY OF THE INVENTION

The present invention is made in view of the abovementioned problems, and aims at providing a manufacturing method for a silicon single crystal that can reduce introduction of dislocation thereinto, even in a case where a required amount of dopant is added to a melt while growing a straight body portion of a silicon single crystal.

The present inventors have conducted intensive research in order to solve the abovementioned problems and have found a correlation between an addition rate of a dopant during growth of a straight body portion of a silicon ingot and an introduction of dislocation into a silicon single crystal. The inventors have completed the present invention by thoroughly studying the addition rate of a dopant during growth of a straight body portion.

A manufacturing method for a silicon single crystal according to the present invention includes a growth step of growing the silicon single crystal by dipping a seed crystal into a melt of silicon and then pulling the seed crystal therefrom; and a dopant addition step included in the growth step, adding a dopant to the melt while a straight body portion of the silicon single crystal is growing; in which in the dopant addition step, a remaining mass of the melt is calculated at the beginning of the dopant addition step, and the dopant is added to the melt at a rate of 0.01 to 0.035 g/min·kg per minute per 1 kg of the remaining mass of the melt thus calculated.

A manufacturing method for a silicon single crystal according to the present invention includes a growth step of growing the silicon single crystal by dipping a seed crystal into a melt of silicon and then pulling the seed crystal therefrom; and a dopant addition step included in the growth step, adding a dopant to the melt while a straight body portion of the silicon single crystal is growing; in which in the dopant addition step, a decreasing rate of resistivity of the silicon single crystal due to addition of the dopant is in a range of 2 to 8% per 10 mm in a growing direction thereof.

The dopant added in the dopant addition step is preferably a sublimable dopant; and in the dopant addition step, the dopant is preferably supplied to the melt by blowing a sublimed dopant onto the melt.

The dopant added in the dopant addition step is preferably arsenic.

An addition rate of the dopant to the melt is preferably adjusted by adjusting an amount of radiant heat from a heat source to inside of a sample tube containing the dopant.

The amount of radiant heat is preferably adjusted by composing the sample tube of opaque quartz.

The amount of radiant heat is preferably adjusted by providing a heat insulation material between the sample tube and the heat source.

In addition, a silicon single crystal pulling device to pull a doped silicon single crystal from the melt by the Czochralski method is preferably used, the device includes: a pulling furnace; a vertically long sample tube that is provided inside or outside the pulling furnace and accommodates a sublimable dopant to be supplied to the melt inside; and a supply unit that is provided inside the pulling furnace, joined with the sample tube, and supplies the sublimable dopant supplied from the sample tube to the melt, in which the sample tube has an area S at one end on a melt-side of inside thereof that is no greater than 7 cm$^2$.

A proportion of the area S (cm$^2$) to a length L (cm) in a longitudinal direction of the sample tube (L/S) is preferably no less than 2.0 (1/cm).

The sample tube is preferably composed of opaque quartz.

A heat insulation material is preferably provided in the sample tube on a melt-side thereof.

The silicon single crystal pulling device further includes a sample chamber that is externally attached to the pulling furnace and accommodates the sample tube inside, in which the sample tube preferably can move up and down between inside of the sample chamber and inside of the pulling furnace.

In addition, a silicon single crystal pulling device is preferably used that pulls a doped silicon single crystal from the melt by the Czochralski method, the device includes: a pulling furnace; a sample chamber that is provided inside or outside the pulling furnace; a sample tube that is provided in the sample chamber, that accommodates a sublimable dopant inside to be supplied to the melt and can move between inside and outside of the sample chamber; a supply unit that is provided inside the pulling furnace, joined with the sample tube, and supplies the sublimable dopant supplied from the sample tube to the melt; and a gas supplying unit that is connected to the sample chamber and can supply cooling gas for cooling an outer surface of the sample tube to the outer surface of the sample tube disposed inside the pulling furnace via inside of the sample chamber.

A temperature of the cooling gas supplied to the inside of the sample chamber is 20 to 30° C.

The cooling gas is supplied to the inside of the sample chamber at a rate of 3 to 10 L/min.

The sample chamber is preferably externally attached to the pulling furnace, and the sample tube preferably can move up and down between the inside of the sample chamber and the inside of the pulling furnace.

According to the present invention, a manufacturing method for a silicon single crystal is provided that can reduce introduction of dislocation thereinto even in a case where a required amount of dopant is added to a melt while growing a straight body portion of a silicon single crystal.

DETAILED DESCRIPTION OF THE INVENTION

Figure 1:
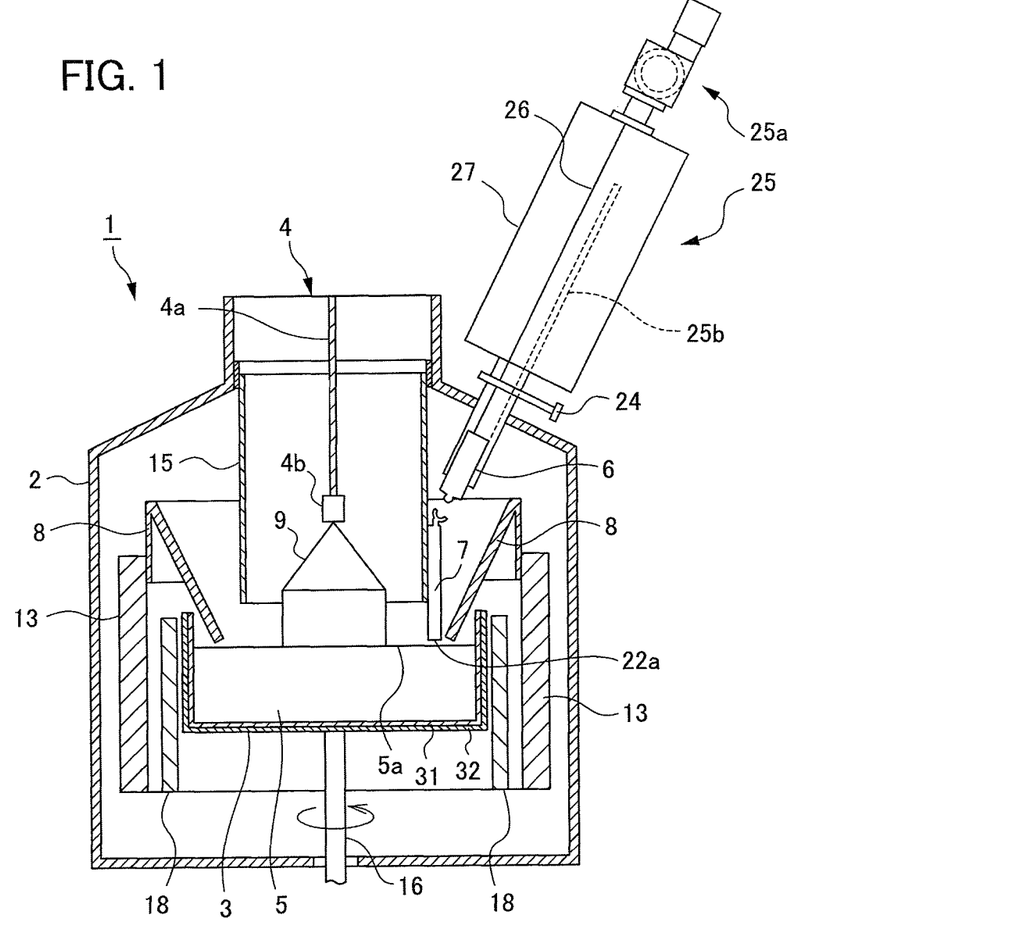
FIG. 1 is a schematic diagram illustrating a first example of a silicon single crystal pulling device used in a first or a second embodiment of the present invention.

A first embodiment of the manufacturing method for a silicon single crystal according to the present invention is hereinafter described in detail with reference to the drawings. FIG. 1 is a schematic diagram illustrating a silicon single crystal pulling device 1 used in a first embodiment of the present invention.

First, the silicon single crystal pulling device 1 used in the present embodiment is described with reference to FIG. 1.

Pulling Furnace

As shown in FIG. 1, the silicon single crystal pulling device 1 used in the present embodiment is provided with a pulling furnace (chamber) 2 that can be used for crystal growth by the CZ method. A crucible 3 is provided inside the pulling furnace 2. The crucible 3 accommodates a melt 5 that is obtained by melting a material consisting of polycrystalline silicon (Si). The crucible 3 is composed of a graphite crucible 32 and a quartz crucible 31 thereinside. A heater 18 for heating and melting a material inside the crucible 3 is provided around the crucible 3. Between the heater 18 and an inner wall of the pulling furnace 2, a heat insulating mould 13 is provided.

In addition, a pulling mechanism 4 is provided above the crucible 3. The pulling mechanism 4 is composed of a pulling cable 4a and a seed crystal holder 4b that is attached to an end thereof. The seed crystal holder 4b holds a seed crystal.

In such a configuration, a material is put in the crucible 3 and heated by the heater 18, thereby melting the material and obtaining the melt 5. After a melt state of the melt 5 becomes stabilized, the pulling cable 4a is lowered to immerse a seed crystal (not shown) held by the seed crystal holder 4b into the melt 5. After settling the seed crystal in the melt 5, the pulling cable 4a is pulled up in order to pull and grow the silicon single crystal (silicon ingot) 9 from the melt 5. When growing the silicon single crystal 9, the crucible 3 is rotated around a rotational axis 16. Meanwhile, the pulling cable 4a of the pulling mechanism 4 is rotated in the same direction as, or a different direction from, a rotational direction of the rotational axis 16. Here, the rotational axis 16 can be driven also in a perpendicular direction and can move the crucible 3 up and down to arbitrary upper and lower positions.

At this time, the inside of the pulling furnace 2 is isolated from open air and depressurized to a vacuum state (for example, a few KPa). In addition, by circulating argon gas as inert gas inside the pulling furnace 2, vaporized material generated inside the pulling furnace 2 can be taken away to the outside of the pulling furnace 2 along with the argon gas. A feed rate of the argon gas can be set for each step in the crystal growth.

A heat insulation member 8 is provided around the silicon single crystal 9, above the crucible 3. The heat insulation member 8 has a function of insulating radiant heat to the seed crystal and the growing silicon single crystal 9, generated in a high-temperature part such as the crucible 3, the melt 5, the heater 18 and the like. Here, a distance between a lower end of the heat insulation member 8 and a surface 5a of the melt 5 can be adjusted either by up and down movement of the crucible 3 or by up and down movement of the heat insulation member 8 by a lifting device.

A flow tube 15 made of quartz is provided above the crucible 3. By providing the flow tube 15, purge gas (gas supplied for removing impurities inside the pulling furnace and then discharged) can be circulated up and down in the pulling furnace 2.

Dopant Supply Mechanism

Next, a dopant supply mechanism that is used for adding a dopant to the melt 5 during growth of the silicon single crystal 9 is described.

The dopant supply mechanism is composed mainly of a sample chamber 27, a sample tube (doping tube) 6, and a supply unit 7 (supply tube). The dopant supply mechanism is used for adding a dopant to the melt 5 during growth of the silicon single crystal 9.

The sample chamber 27 accommodates inside a dopant to be added to the melt 5. The sample chamber 27 is externally attached to a flange portion of the pulling furnace via a shielding means 24 (described later). Here, the dopant to be accommodated in the sample chamber 27 is a sublimable dopant, for example, an n-type dopant such as arsenic (As). Since arsenic is a highly sublimable dopant, arsenic can be sublimed from solid phase to vapor phase at a relatively low temperature when used as a dopant.

When accommodating the dopant in the sample chamber 27, it is preferable that the dopant is put into the sample tube 6 and the sample tube 6 is housed in the sample chamber 27.

The sample tube 6 has a substantially cylindrical shape and moves up and down between the sample chamber 27 and the supply unit 7 by way of a lifting means 25. The sample tube 6 is disposed along a groove of a guide rail 25b provided to be extend from the inside of the sample chamber 27 to the inside of the pulling furnace 2. The sample tube 6 moves up and down from the inside of the sample chamber 27 to the inside of the pulling furnace 2 being guided by the guide rail 25b. To move the sample tube 6 up and down, a wire 26 attached to the sample tube 6 is driven by a wire mechanism 25a.

The sample tube 6 is composed of quartz. Thus, the dopant inside the sample tube 6 is heated by radiant heat from the outside of the sample tube 6. Therefore, as described later, when the sample tube 6 goes down the guide rail 25b and reaches a stopping position where the dopant is injected, the sublimable dopant inside the sample tube 6 is heated by radiant heat from the melt 5 and the like, and thus sublimed to vapor and supplied to the melt 5.

The shielding means 24 is provided between the sample chamber 27 and the pulling furnace 2. The shielding means 24 thermally shields the sample chamber 27 from the pulling furnace 2. By providing the shielding means 24, radiant heat from the inside of the pulling furnace 2 is thermally blocked and the dopant can be sublimed at a desired timing and added to the melt 5.

The supply unit 7 is disposed outside the flow tube 15 such that an open end 22a is positioned in the vicinity of the surface 5a of the melt 5 and an opposite end can be joined with the sample tube 6. To add a dopant to the melt 5, the shielding means 24 is opened and the sample tube 6 is lowered. By lowering the sample tube 6, the sample tube 6 is joined to the supply unit 7, and thus the inside of the sample tube 6 and the open end 22a of the supply unit 7 are communicatively connected. Thereafter, a sublimable dopant that is present in the sample tube 6 is heated and sublimed by radiant heat from the melt 5 and the like. The dopant that is sublimed and vaporized is blown onto the surface 5a of the melt 5. Gas of the dopant blown onto the surface 5a of the melt 5 is introduced into the melt 5, and doping is finished.

Manufacturing Method of Silicon Single Crystal of First Embodiment of Present Invention Next, a manufacturing method of the silicon single crystal according to the first embodiment of the present invention is described. The manufacturing method of the silicon single crystal according to the present embodiment can be divided into: a dipping step in which a seed crystal is dipped in the surface 5a of the melt 5; and a growth step in which the silicon single crystal 9 is grown by pulling the seed crystal dipped in the surface 5a of the melt 5 by the pulling mechanism 4. Each step is described hereinafter.

Dipping Step

First, the dipping step is described. This step is a step in which the seed crystal is dipped in the melt 5.

The seed crystal used in the dipping step is cut out from a silicon single crystal. The seed crystal may or may not include a substance as a dopant. In a case where a dopant is included in the seed crystal, the dopant is preferably the same type as that included in the melt 5.

In addition, at the time of dipping the seed crystal in the melt 5, a dopant may or may not be added in advance to the melt 5. By adding a dopant in advance to the melt 5, a silicon single crystal 9 of low resistivity can be obtained. However, as already described, if the melt 5 contains a high concentration of dopant from the beginning, the silicon single crystal 9 may be broken during growth thereof. In this case, a low concentration of dopant can be contained in the melt 5 at the beginning of growth of the silicon single crystal 9, and then a required concentration of dopant can be added at the time of growing a straight body portion of the silicon single crystal 9, as described later.

Growth Step

Figure 2:
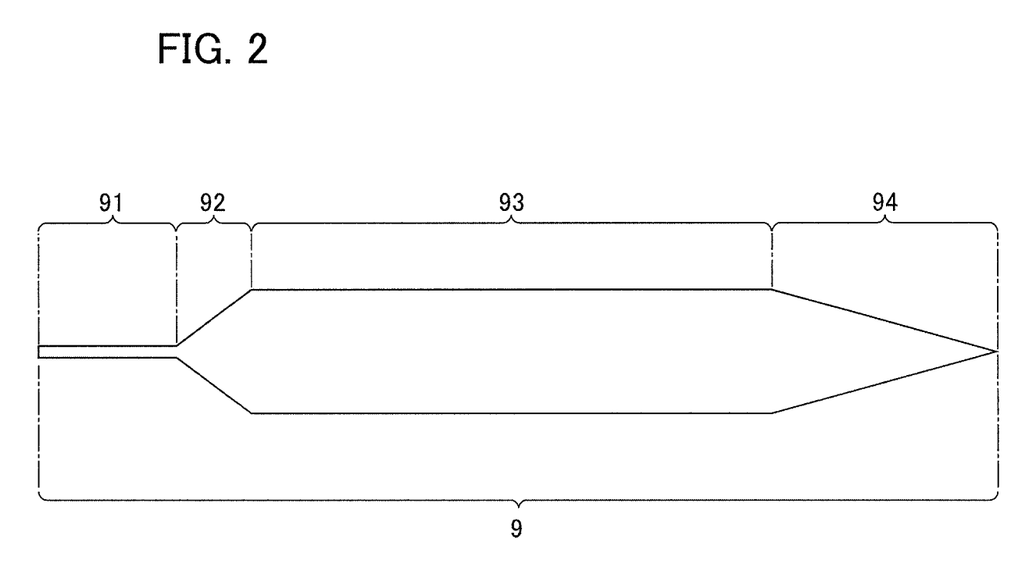
FIG. 2 is a diagram showing an example of a silicon single crystal 9 manufactured in the first embodiment of the present invention.

Next, the growth step in which the silicon single crystal 9 is grown by pulling the seed crystal that is dipped in the melt 5 is described. FIG. 2 is a diagram showing an example of a silicon single crystal 9 manufactured in the present embodiment.

As shown in FIG. 2, the silicon single crystal 9 has, in an order from the seed crystal, a neck portion 91 that has a slightly smaller diameter, a shoulder portion 92 that gradually grows in diameter, a straight body portion 93 that has a constant diameter, and a tail portion 94 that gradually reduces in diameter. In manufacturing the silicon single crystal 9, the silicon single crystal 9 is grown in an order of the neck portion 91, the shoulder portion 92, the straight body portion 93, and then the tail portion 94. A silicon wafer that can be used for manufacturing a semiconductor device is cut out from the straight body portion 93 of the silicon single crystal 9.

As already described, in order to manufacture the silicon single crystal 9 of low resistivity including a large amount of dopant, a large amount of dopant must be added to the melt 5. In the growth method of a silicon single crystal according to the present embodiment, a dopant addition step in which the dopant is added to the melt 5 during growth of the straight body portion 93 is included in the growth step of the silicon single crystal 9.

Dopant Addition Step

Next, the dopant addition step that is performed during growth of the straight body portion 93 in the growth step of the silicon single crystal 9 is described.

The dopant used in the present embodiment is a sublimable dopant, which is preferably arsenic. Such an element is highly sublimable and preferably used in the present embodiment, in which the dopant is supplied to the melt by blowing gas obtained by subliming the dopant onto the melt 5.

As already described, the dopant addition step is performed during growth of the straight body portion 93 in the growth step of the silicon single crystal 9. In this step, the sublimable dopant is sublimed and vaporized using the abovementioned dopant supply mechanism and then the vaporized dopant is blown onto the surface 5a of the melt 5, thereby supplying the dopant into the melt 5.

By adding the dopant to the melt 5, the solidification point of the melt 5 is lowered by cryoscopy. If only a small amount of dopant is added, cryoscopy is small and does not greatly affect growth of the silicon single crystal. However, in a case where a large amount of dopant is added to the melt 5 in order to obtain the silicon single crystal 9 of low resistivity, cryoscopy of the melt 5 becomes considerably large and growth that is different from normal silicon growth interface begins on a crystal growth interface due to compositional supercooling. Such a growth inhibits single crystallization of silicon. A degree of inhibition of single crystallization of silicon due to the addition of a dopant is relatively great in growth of the shoulder portion 92 and relatively small in growth of the straight body portion 93. For such a reason, in the growth method of a silicon single crystal according to the present embodiment, the dopant addition step is performed during growth of the straight body portion 93.

The addition rate of a dopant in the dopant addition step is defined per minute per 1 kg of the remaining melt 5 at the beginning of the dopant addition step, which is 0.01 to 0.035 g/min·kg. In other words, in a case where 100 kg of the melt 5 remains at the beginning of the dopant addition step, the dopant can be added to the melt 5 at a rate of 1.0 to 3.5 g/min. The addition rate of the dopant is preferably in a range of 0.015 to 0.030 g/min·kg.

A mass of the remaining melt 5 at the beginning of the dopant addition step can be calculated either from a mass change of the crucible 3 containing the melt 5 or from a mass of the silicon single crystal 9 which is already crystallized, obtained from a length thereof. A method for calculating the mass of the remaining melt 5 at the beginning of the dopant addition step is not particularly limited.

In the melt 5 to which a dopant is added, a concentration distribution of the dopant does not immediately become uniform. Therefore, the quality of a portion of the silicon single crystal 9, which is pulled in a certain amount of time after addition of the dopant to the melt, is not stabilized. Consequently, if the addition rate of the dopant is too low, the straight body portion 93 of the silicon single crystal 9 would not have much of a usable portion of a stable quality, and a yield thereof would be affected. From such a perspective, as shown in the abovementioned range, the addition rate of the dopant that is at least 0.01 g/min·kg can provide a superior yield. In addition, the addition rate of the dopant that is no greater than 0.035 g/min·kg can prevent dislocation of the silicon single crystal 9.

A method for adjusting the addition rate of the dopant is not particularly limited. As such a method, a method of adjusting an amount of radiant heat from a heat source to the inside of the sample tube 6 containing a dopant can be exemplified.

For example, the addition rate of the dopant can be adjusted by adjusting a position of the sample tube 6. As already described, the dopant is added to the melt 5 in a state of being sublimed by radiant heat from a heat source such as the melt 5. Consequently, with greater distance between a position where the sample tube 6 is joined with the supply unit 7, which is a stopping position of the sample tube 6, and the surface 5a of the melt 5, the amount of radiant heat applied to the dopant becomes smaller, and therefore the addition rate of the dopant is reduced. On the contrary, with a smaller distance between the stopping position of the sample tube 6 and the surface 5a of the melt 5, the amount of radiant heat applied to the dopant becomes greater, and therefore the addition rate of the dopant is increased.

The amount of radiant heat applied to the dopant is affected not only by the distance between the sample tube 6 and the surface 5a of the melt 5, which is described above, but also by a temperature of the melt 5, a distance between the sample tube 6 and the heater 18, and the like. Therefore, according to a disposition condition of devices in the pulling furnace 2 used, the stopping position of the sample tube 6, an installation condition of the heat insulation member 8 and the like may be accordingly set such that the addition rate of the dopant is in the abovementioned range of 0.01 to 0.035 g/min·kg. To this end, an exploratory manufacturing experiment may be performed for condition setting, and a time required for completely vaporizing a dopant of known mass by radiant heat from the melt 5 and the like may be measured. Furthermore, an addition rate of the dopant to the melt 5 may be calculated from the time thus measured, and adjusted to be in the desired range (0.01 to 0.035 g/min·kg). As a method for adjusting the addition rate of the dopant to the melt 5 to be in such a range, a method of adjusting a distance between the surface 5a of the melt 5 and the stopping position of the sample tube 6 to be in a range of 300 to 600 mm can be exemplified.

As described above, an amount of radiant heat to the dopant inside the sample tube 6 can be adjusted by adjusting a stopping position of the sample tube 6 and the like. The radiant heat to the dopant inside the sample tube 6 may be adjusted also by composing the sample tube 6 of opaque quartz, which does not easily transmit radiant heat. In the sample tube 6, a lower part of the sample tube 6 to which the radiant heat is applied can be exemplified as a portion to be composed of opaque quartz; however, the portion can be accordingly determined considering a positional relationship between a source of radiant heat and the sample tube 6.

In addition, the amount of radiant heat to the dopant inside the sample tube 6 can be adjusted by providing, between the sample tube 6 and a heat source such as the melt 5, the heater 18 and the like, a heat insulation material or a member that reflects the radiant heat. A carbon fiber material and a graphite material, which are low in thermal conductivity, can be exemplified as the heat insulation material, though not particularly limited thereto. As the member that reflects the radiant heat, molybdenum can be exemplified.

The first embodiment of the present invention is a manufacturing method for a silicon single crystal that grows a silicon single crystal 9 by dipping a seed crystal into a silicon melt 5 and then pulling the seed crystal therefrom, and includes a dopant addition step of adding a dopant to the melt 5 while a straight body portion 93 of the silicon single crystal 9 is growing, in which in the dopant addition step, a remaining mass of the melt 5 is calculated at the beginning of the step, and the dopant is added to the melt 5 at a rate of 0.01 to 0.035 g/min·kg per minute per 1 kg of the remaining mass of the melt 5 thus calculated. In other words, the dopant is added to the melt 5 at a rate of 0.01 to 0.035 g/min·kg, wherein the rate corresponds to the remaining mass of the melt 5 thus calculated. As a result, even in a case where the silicon single crystal 9 of low resistivity including a large amount of dopant is manufactured, introduction of dislocation into the silicon single crystal 9 can be prevented, thereby improving a yield thereof.

In addition, the dopant added in the dopant addition step is a sublimable dopant, and in the dopant addition step, the dopant is supplied to the melt 5 by spraying a sublimed dopant thereonto. Such a supplying method is preferable because a dopant supply port is not required to contact the surface 5a of the melt 5 and a change in convection of the melt 5 due to the dopant supply port contacting the surface 5a of the melt 5 is prevented, thereby preventing dislocation of the silicon single crystal 9 that is growing.

Manufacturing Method of Silicon Single Crystal of Second Embodiment of Present Invention Next, a manufacturing method of a silicon single crystal according to the second embodiment of the present invention is described. In the manufacturing method of the silicon single crystal according to the second embodiment, introduction of dislocation into the silicon single crystal 9 is prevented not by controlling the addition rate of the dopant to the melt 5, but by controlling a decreasing rate of resistivity of the silicon single crystal 9 due to the addition of the dopant. It should be noted that a description of a part similar to the first embodiment, which has already been described, is omitted and differences from the first embodiment are mainly described.

As in the first embodiment, in the growth method of silicon single crystal according to the present embodiment, a dopant addition step is performed during growth of the straight body portion 93 in the growth step of the silicon single crystal 9. In addition, in the dopant addition step, a decreasing rate of resistivity of the silicon single crystal 9 due to the addition of the dopant is in the range of 2 to 8% per 10 mm in a growing direction thereof. Here, the growing direction of the silicon single crystal 9 is a direction of pulling and growing the silicon single crystal 9, i.e. a longitudinal direction of the silicon single crystal 9.

As described in the first embodiment, the present inventors studied and found that introduction of dislocation into the silicon single crystal 9 can be inhibited by adding a dopant to the melt 5 at an addition rate of 0.01 to 0.035 g/min·kg per 1 kg of the melt 5 remaining in the crucible 3. The decreasing rate of resistivity of the silicon single crystal 9 is determined by the addition rate of the dopant to the melt 5 and crystal growth rate (pulling rate) of the silicon single crystal 9. In a case where the silicon single crystal 9 is pulled at 0.5 mm/min, which is a standard pulling rate, and the dopant is added to the melt 5 at the abovementioned addition rate of 0.01 g/min·kg, the decreasing rate of resistivity of the silicon single crystal 9 is 2% per 10 mm in the growth direction of the silicon single crystal 9. Furthermore, in a case where the dopant is added to the melt 5 at the abovementioned addition rate of 0.035 g/min·kg, the decreasing rate of resistivity of the silicon single crystal 9 is 8% per 10 mm in the growth direction of the silicon single crystal 9. As described above, the decreasing rate of resistivity of the silicon single crystal 9 due to the addition of the dopant being in a range of 2 to 8% per 10 mm in a growing direction thereof can inhibit introduction of dislocation into the silicon single crystal 9.

It should be noted that, if a dopant is already contained in the melt 5, the resistivity decreases according to growth of the silicon single crystal 9 by a segregation effect, even if a dopant is not added in the dopant addition step. However, the decreasing rate of resistivity of the silicon single crystal 9 due to the segregation effect is about 1% per 10 mm in a growing direction thereof. Therefore, adding a dopant by providing the dopant addition step as in the present embodiment, such that the decreasing rate of resistivity of the silicon single crystal 9 per 10 mm in the growing direction is 2 to 8%, is clearly different from the segregation effect.

According to the manufacturing method of silicon single crystal of the present embodiment, even in a case where manufacturing the silicon single crystal 9 of low resistivity including a large amount of dopant, introduction of dislocation into the silicon single crystal 9 can be prevented, thereby improving a yield thereof.

Embodiments of the present invention have been described in detail; however, the present invention is not limited thereto and can be changed and implemented accordingly within a scope of the objective of the present invention.

For example, in the above embodiments, the sublimable dopant is vaporized by radiant heat from a heat source such as the melt 5, then the vapor of the dopant is blown onto the surface 5a of the melt 5, thereby supplying the dopant into the melt 5; however, the present invention is not limited thereto. For example, carrier gas containing a dopant can be prepared in advance and blown onto the surface 5a of the melt 5, thereby providing the dopant to the melt 5. In this case, the dopant to be added to the melt 5 is not required to be sublimable.

Figure 3:
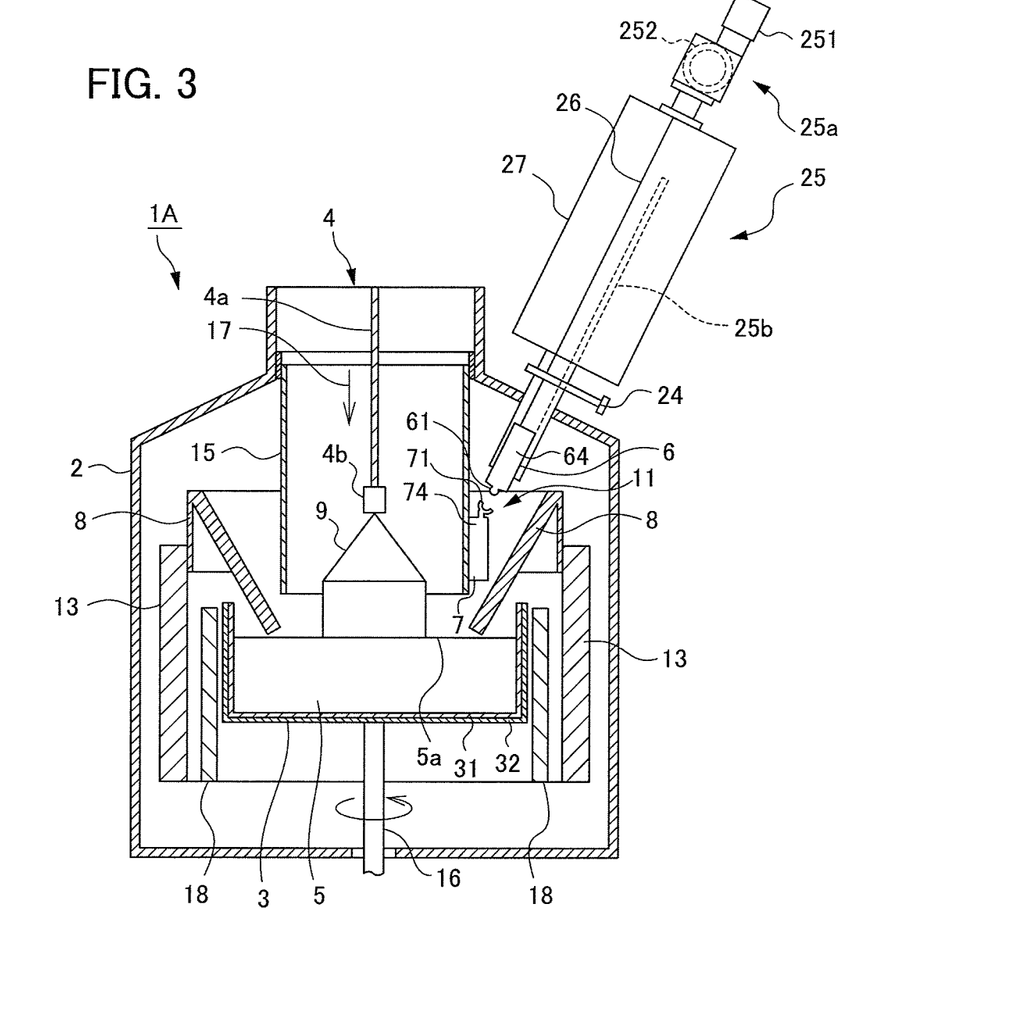
FIG. 3 is a schematic diagram illustrating a second example of the silicon single crystal pulling device used in the first or the second embodiment of the present invention.

Second Example of Silicon Single Crystal Pulling Device Used in First or Second Embodiment of Present Invention Next, a second example of the silicon single crystal pulling device 1A used in the above embodiments is described in detail. FIG. 3 is a schematic diagram illustrating a second example of the silicon single crystal pulling device used in the first or the second embodiment of the present invention. As shown in FIG. 3, the silicon single crystal pulling device 1A includes a pulling furnace (chamber) 2, a crucible 3, a heater 18, a heat insulating mould 13, a flow tube 15, a pulling mechanism 4, a sample chamber 27, a sample tube 6, a supply unit 7, a joint means 11, and a heat insulation member 8. It should be noted that, in the following description, similar parts to those in the abovementioned silicon single crystal pulling device 1 are designated by the same reference numerals and descriptions thereof may possibly be omitted. As used herein, "inside" indicates a side to a center of the pulling furnace 2 and "outside" indicates a side away from a center of the pulling furnace 2.

Figure 4A:
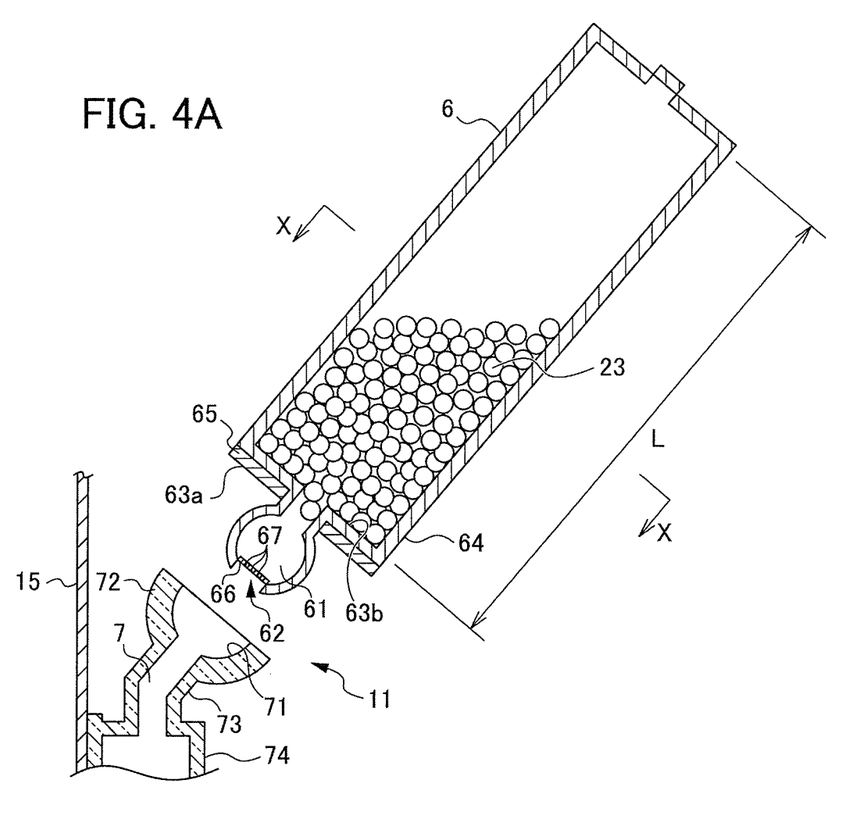
FIG. 4A is a partially-enlarged vertical sectional view of a state where a sample tube according to the second example of the silicon single crystal pulling device is about to be joined with a supply unit 7.
Figure 4B:
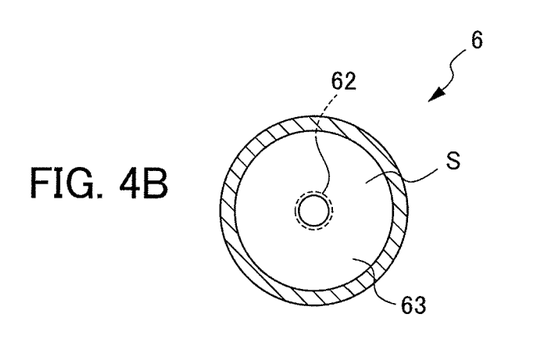
FIG. 4B is a cross-sectional view taken along a line X-X of FIG. 4A.
Figure 5:
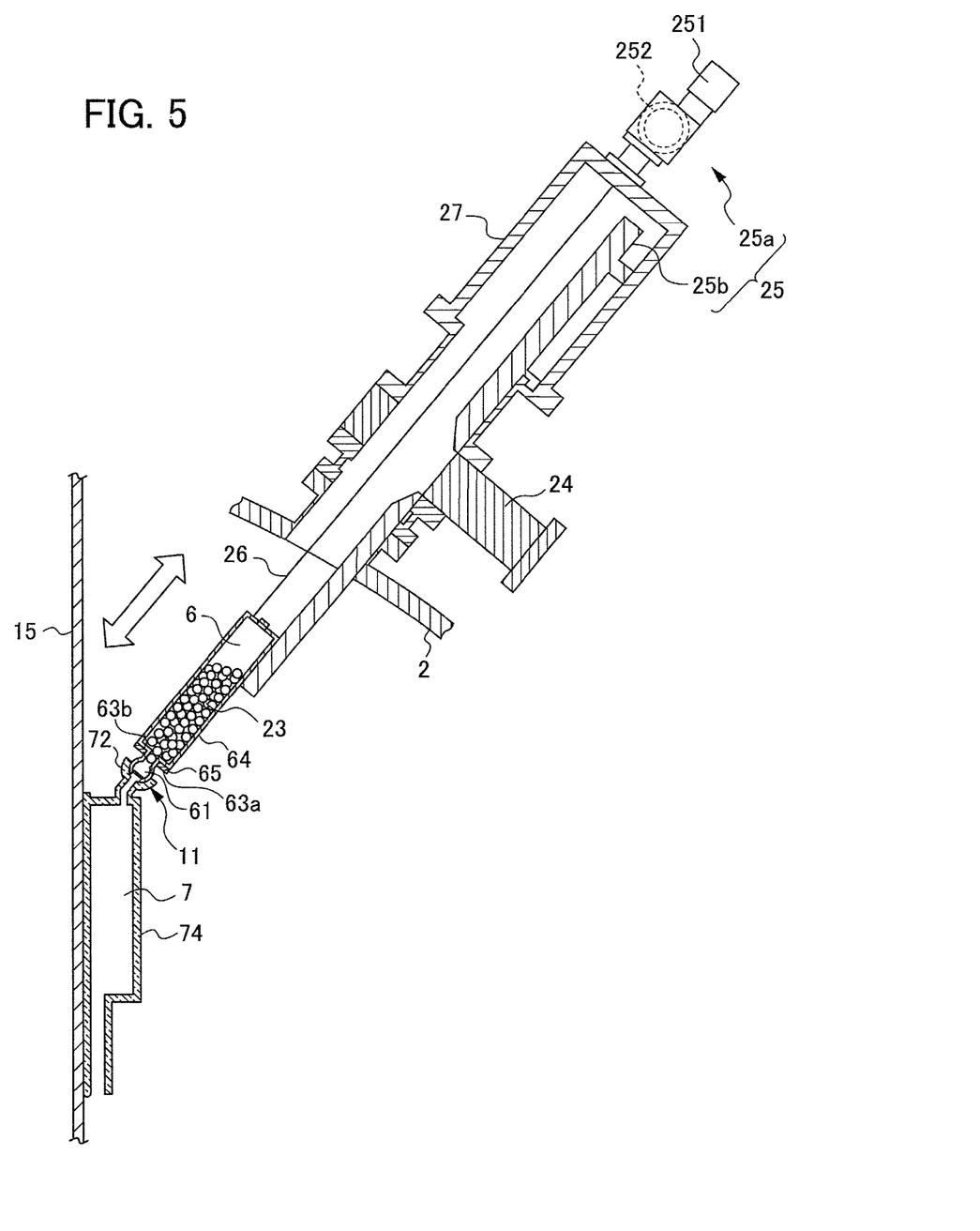
FIG. 5 is a partially-enlarged vertical sectional view of a state where the sample tube according to the second example of the silicon single crystal pulling device is joined with the supply unit.

The silicon single crystal pulling device 1A is characterized in a shape of the sample tube 6. Components of the silicon single crystal pulling device 1A are hereinafter described. FIG. 4A is a partially-enlarged vertical sectional view of a state where the sample tube 6 is about to be joined with a supply unit 7. The pulling furnace 2 and the lifting means 25 are omitted in FIG. 4A. FIG. 4B is a cross-sectional view taken along a line X-X of FIG. 4A and a diagram showing the inside of the sample tube 6. A plate-like body 66 is omitted in FIG. 4B. FIG. 5 is a partially-enlarged vertical sectional view of the silicon single crystal pulling device 1A in a state where the sample tube 6 is joined with a supply unit 7.

As shown in FIGS. 3 to 5, the sample chamber 27 contains a sublimable dopant 23 that dopes the silicon single crystal 9 to be grown. The sample chamber 27 is externally attached to an upper part of the pulling furnace 2 via a shielding means 24 (described later).

When housing the sublimable dopant 23 in the sample chamber 27, the sublimable dopant 23 is put into the sample tube 6 and the sample tube 6 is housed in the sample chamber 27. The sample tube 6 has a vertically elongated and substantially cylindrical shape. The sample tube 6 is disposed along a groove of a guide rail 25b provided to be extend from the inside of the sample chamber 27 to the inside of the pulling furnace 2. The sample tube 6 moves up and down from the inside of the sample chamber 27 to the inside of the pulling furnace 2 being guided by the guide rail 25b. The sample tube 6 is described later in detail.

The lifting means 25 moves the sample tube 6 up and down so as to join the sample tube 6 with the supply unit 7. The lifting means 25 is provided with the wire mechanism 25a. The wire mechanism 25a moves the sample tube 6 up and down along the guide rail 25b on which the sample tube 6 can slide. The wire mechanism 25a is provided with a wire 26 that is attached to the sample tube 6, a winding drum 252 that winds the wire 26, and a motor 251 that drives the winding drum 252. The wire mechanism 25a is a mechanism for moving the sample tube 6 up and down along the guide rail 25b with the wire 26. The wire mechanism 25a drives the winding drum 252 by way of the motor 251 and adjusts a height of the sample tube 6 via the wire 26.

The guide rail 25b is provided from the inside of the sample chamber 27 toward the supply unit 7, and defines positions to which the sample tube 6 moves up and down. The guide rail 25b is preferably composed of a graphite material. By composing the guide rail 25b of a graphite material, the guide rail can be highly heat-resistant.

As shown in FIG. 3, the lifting means 25 is disposed at a position not interfering with the silicon single crystal 9 and the pulling mechanism 4, and not contacting the melt 5. By disposing the lifting means 25 at a position not interfering with the pulling mechanism 4, the sublimable dopant 23 can be put into the melt 5 while pulling the silicon single crystal 9.

The shielding means 24 thermally shields the sample chamber 27 from the pulling furnace 2. The shielding means 24 is provided to be orthogonal to a direction in which the guide rail 25b extends from the inside of the sample chamber 27 to the inside of the pulling furnace 2. A sliding gate valve is preferably used as the shielding means 24. Radiant heat and the atmosphere inside the pulling furnace 2 are thermally shielded from the inside of the sample chamber 27 by the shielding means 24. As a result, adjustment of pressure inside the sample chamber 27 at a desired timing is possible, which allows vaporization of the sublimable dopant 23 by opening the shielding means 24, and repeated input of the sublimable dopant 23 into the sample tube 6 by closing the shielding means 24 and restoring the pressure inside the sample chamber 27 to atmospheric pressure.

As shown in FIG. 4A, the sample tube 6 has a vertically elongated shape and includes a sample tube main body 64 that is tubular, an outer end surface 63a of an end on the melt 5 side, and a convex portion 61 that projects from a substantially central portion of the outer end surface 63a toward the supply unit 7. The sample tube 6 is composed of opaque quartz, which is lower in thermal conductivity than transparent quartz.

A proportion (L/S) of a length L (cm) of the sample tube 6 in a longitudinal direction to an area S (cm$^2$) of an inner end surface 63b of an end on the melt 5 side is no less than 2.0 (1/cm) and preferably no less than 4.5 (1/cm). In the silicon single crystal pulling device 1A, the inner end surface 63b has a substantially round shape. An internal diameter of the inner end surface 63b is, for example, 1.5 to 3 cm. An area S of the inner end surface 63b is preferably no greater than 7 cm$^2$, for example, 1.8 to 7 cm$^2$. A length L of the sample tube 6 is, for example, 14 to 20 cm. As shown in FIG. 4B, the area S (cm$^2$) is an area of a circle inside the cross-section taken along the line X-X in FIG. 4A. A central hole that continues to the convex portion 61 is included in the area of the circle.

The heat insulation member 65 is provided on a melt side (lower side) of the sample tube 6. The heat insulation member 65 is composed of a member low in thermal conductivity, such as a carbon fiber material.

The convex portion 61 has a substantially spherical shape. "Substantially spherical shape" indicates a shape that is not a perfect sphere but a large portion thereof has a spherical curved surface. The convex portion 61, along with the supply unit 7 (described later), joins the sample tube 6 with the supply unit 7. The convex portion 61 thus constitutes the joining means 11 that communicatively connects the sample tube 6 and the supply unit 7.

The convex portion 61 is hollow. In an end portion of the sample tube 6 on a side to the supply unit 7, an outlet opening 62 is provided that communicatively connects the inside of the sample tube 6 to the outside. To the outlet opening 62, a plate-like body 66, on which a plurality of through holes 67 are formed, is attached. The abovementioned joining means 11 is partitioned into a space on a sample tube 6 side and a space on a supply unit 7 side by the plate-like body 66. The plate-like body 66 is provided at an end of the sample tube 6 on the supply unit side and has a plurality of through holes 67. A diameter of the plurality of through holes 67 is, for example, about 1 to 3 mm. When the shielding means 24 opens, the sample tube 6 slides down the guide rail 25b by a drive of the wire mechanism 25a. After sliding down, the sample tube 6 is joined with the supply unit 7 provided inside the pulling furnace 2. When the sample tube 6 is joined with the supply unit 7, the sublimable dopant 23 that is vaporized circulates from the inside of the sample tube 6 into the supply unit 7 via the plurality of through holes 67 on the plate-like member 66 attached to the outlet opening 62.

As shown in FIG. 3, the supply unit 7 is disposed at a position not interfering with the silicon single crystal 9 and the pulling mechanism 4, and not contacting the melt 5. Any material that can resist high temperatures caused by radiant heat from the melt 5 and the like, specifically quartz, can be used as a material for the supply unit 7.

The supply unit 7 includes a supply unit main body 74 and a joining portion 72 that guide the sublimable dopant 23 to the melt 5. The joining portion 72 is provided in an upper end portion of the supply unit 7 and projects toward the sample tube 6. The joining portion 72 includes a concave portion 71 that has a concave shape into which the convex portion 61 of the sample tube 6 can fit. The convex portion 61 of the sample tube 6 and the concave portion 71 of the supply unit 7 constitute the joining means 11 that joins the sample tube 6 to the supply unit 7. The joining means 11 is a ball joint structure in which the convex portion 61 is joined with the concave portion 71. The concave portion 71 is disposed on a track of the guide rail 25b so as to fit onto and to be joined with the convex portion 61 of the sample tube 6 that has slid down the guide rail 25b.

An inner face of the concave portion 71 is a contact face with the convex portion 61 of the sample tube 6, and formed to be a curved surface. The inner face of the concave portion 71 has a curved shape corresponding to an outer face of the convex portion 61 of the sample tube 6. At a bottom of the concave portion 71, a supply port 73 is provided. The supply port 73 continues to the inside of the supply unit 7, which is hollow.

As described in the above embodiment, most of the radiant heat generated in high-temperature parts such as the crucible 3, the melt 5, the heater 18 and the like, is insulated from the seed crystal and the growing silicon single crystal 9 by the heat insulation member 8. A distance between a lower end of the heat insulation member 8 and the surface 5a of the melt 5 can be adjusted either by up and down movement of the crucible 3 or by up and down movement of the heat insulation member 8 by the lifting device.

When the sublimable dopant 23 is put into the pulling furnace 2 in operation, the sample chamber 27 is opened while the shielding means 24 is closed, thereby putting the sublimable dopant 23 into the sample tube 6 stored in the sample chamber 27. As shown in FIG. 5, the sample tube 6 is connected to the wire mechanism 25a of the lifting means 25. The sample tube 6 moves up and down by the wire mechanism 25a, sliding along the guide rail 25b.

Thereafter, the shielding means 24 is opened when doping of the silicon single crystal 9 with the sublimable dopant 23 is started, in other words when the shoulder portion and a first half of the straight body portion of the silicon single crystal 9 have grown. Here, to open the shielding means 24, the sublimable dopant 23 is stored at a predetermined position in the sample chamber 27, a door of the sample chamber 27 is closed, and a pressure inside the pulling furnace 2 and a pressure inside the sample chamber 27 are adjusted by operating a vacuum pump on the sample chamber 27 side, and then the shielding means 24 is opened.

When the sample tube 6 guided by the guide rail 25b enters the pulling furnace 2, a part of the radiant heat from the surface 5a of the melt 5 to the silicon single crystal 9 is applied to a melt side end (lower end) of the sample tube 6. In addition, a part of the radiant heat from the heat insulation member 8 is also applied to the lower end of the sample tube 6. The sample tube 6 has a vertically elongated shape and is configured such that the area S of an inner surface of an end thereof on a side to the melt 5 is no greater than 7 cm². In addition, the sample tube 6 is configured such that a proportion (L/S) of a length L (cm) of the sample tube 6 in a longitudinal direction to an area S (cm²) of an inner end surface 63b of an end on the melt 5 side is no less than 2.0 (1/cm). Consequently, the sublimable dopant 23 in a solid state stored in the sample tube 6 can be easily vaporized in a lower portion of the sample tube 6 to which radiant heat is applied, but not easily vaporized in an upper portion thereof that is opposite to the inner end surface 63b. As the sublimable dopant 23 in the lower portion thereof is vaporized and supplied to the supply unit 7, the sublimable dopant 23 in the upper portion of the sample tube 6 moves down to the lower portion thereof and is vaporized.

As shown in FIG. 5, the sample tube 6 is joined with the supply unit 7 that is disposed below the sample tube 6. More specifically, the convex portion 61, provided in an end portion of the sample tube 6 on a side to the supply unit 7, fits into the concave portion 71 of the joining portion 72. The concave portion 71 is provided in an end portion of the supply unit 7 on a side to the sample tube 6. In an end portion of the sample tube 6 on a side to the supply unit 7, the outlet opening 62 is formed. To the outlet opening 62, the plate-like body 66, on which a plurality of the through holes 67 are provided, is attached. As a result, when the convex portion 61 and the concave portion 71 are joined with each other as the joining means 11, the sublimable dopant 23 that is vaporized is supplied from the sample tube 6 to the supply unit 7 via the plurality of through holes 67 on the plate-like body 66.

The sublimable dopant 23 is supplied from the supply unit 7, being sprayed onto the melt 5. A supply rate of the sublimable dopant 23 to the melt 5 is defined per minute per 1 kg of the remaining melt 5 at the beginning of supply of the sublimable dopant 23 to the melt 5. The supply rate is, as described in the first embodiment, 0.01 to 0.035 g/min·kg.

By using the silicon single crystal pulling device 1A, the following effect is achieved.

In the silicon single crystal pulling device 1A, the sample tube 6 has a vertically elongated shape. In addition, the sample tube 6 is configured such that an area S (cm²) of the inner end surface 63b of an end on the melt 5 side is no less than 7 cm². Consequently, the sublimable dopant 23 is disposed longitudinally from an upper side to a lower side in the sample tube 6. The sublimable dopant 23 in the lower portion of the sample tube 6 is vaporized faster than that in the upper portion thereof, since radiant heat is applied from below the sample tube 6. As described above, there is a time lag in vaporization between the sublimable dopant 23 in the lower portion of the sample tube 6 and the sublimable dopant 23 in the upper portion thereof. Consequently, the sublimable dopant 23 is gradually vaporized and a vaporization rate thereof can be adjusted.

In addition, the sample tube 6 is configured such that a proportion (L/S) of a length L (cm) of the sample tube 6 in a longitudinal direction to an area S (cm²) of an inner end surface 63b of an end on the melt 5 side is no less than 2.0 (1/cm). Therefore, there is a more preferable time lag in vaporization between the sublimable dopant 23 in the lower portion of the sample tube 6 and the sublimable dopant 23 in the upper portion thereof. Consequently, the vaporization rate thereof can be adjusted more preferably.

Further, by increasing an amount of the sublimable dopant 23 stored in the sample tube 6, the time lag in vaporization is increased between the sublimable dopant 23 in the lower portion of the sample tube 6 and the sublimable dopant 23 in the upper portion thereof. Consequently, the vaporization rate of the sublimable dopant 23 can be adjusted by adjusting the amount of the sublimable dopant 23 stored in the sample tube 6.

Moreover, since there is a time lag in vaporization between the sublimable dopant 23 in the lower portion of the sample tube 6 and the sublimable dopant 23 in the upper portion thereof, the sublimable dopant 23 can be supplied to the melt 5 in a continuous manner.

In the silicon single crystal pulling device 1A, the sample tube 6 is made of opaque quartz, which is lower in thermal conductivity than transparent quartz. The sample tube 6 is thus made to be less conductive Of radiant heat from the melt 5 and the like, than in a case where transparent quartz is used. As a result, a sharp rise in the temperature of the sample tube 6 due to radiant heat and rapid vaporization of the sublimable dopant 23 can be prevented.

In the silicon single crystal pulling device 1A, the heat insulation member 65 is provided in a lower portion of the sample tube 6. The sample tube 6 is thus made to be less conductive of radiant heat from the melt 5 and the like, than in a case where the heat insulation member 65 is not provided. As a result, a sharp rise in the temperature of the sample tube 6 due to radiant heat and rapid vaporization of the sublimable dopant 23 can be prevented.

In the silicon single crystal pulling device 1A, the sample chamber 27 is provided that is externally attached to the pulling furnace 2 and stores the sample tube 6 thereinside, and the sample tube 6 is configured to be ascendable and descendable between the inside of the sample chamber 27 and the inside of the pulling furnace 2. In such a configuration, the sublimable dopant 23, while being stored in the sample chamber 27, is not affected by radiant heat from the melt 5 and the like inside the pulling furnace 2. Consequently, a timing of vaporization of the sublimable dopant 23 can be adjusted by positioning the sample tube 6 either in the sample chamber 27 or in the pulling furnace 2.

The silicon single crystal pulling device 1A is described above with a specific example; however, the silicon single crystal pulling device 1A is not limited thereto.

For example, in the above example, the guide rail 25b is provided with a groove along which the sample tube 6 can move up and down, and the sample tube 6 is configured to fit into a shape of the groove. However, the present invention is not limited thereto and it can be configured to decrease an amount of radiant heat applied to the sample tube 6 by increasing an area of the guide rail 25b covering the sample tube 6.

In addition, in the above example, the sample tube 6 is configured to move down into the pulling furnace 2 being guided by the guide rail 25b and to be joined with the supply unit 7. However, the sample tube 6 can be configured to be positioned more to an upper side of the pulling furnace 2. By increasing a distance between the surface 5a of the melt 5 and the sample tube 6 positioned inside the pulling furnace, radiant heat applied to the sample tube 6 can be decreased. A vaporization rate of the sublimable dopant 23 can be thus lowered and adjusted.

In addition, in the above example, the sample chamber 27 is externally attached to the pulling furnace 2; however, the sample chamber 27 can be attached within the pulling furnace 2.

For example, by providing a guide rail that extends from the inside of a sample chamber which is inside of a pulling furnace toward a melt outside the sample chamber, and a slide gate valve between the sample chamber and an atmosphere inside the pulling furnace, the sample tube can be configured to be moved up and down along the guide rail by a wire mechanism.

In addition, the sample chamber 27 is provided in the above example; however, the present invention can be configured without the sample chamber 27 as long as the sublimable dopant 23 can be vaporized and supplied into the supply unit 7.

For example, the present invention can be configured such that a sample tube is attached within a pulling furnace and driven by a wire mechanism, thereby connecting the sample tube to a supply unit. The layout of a sample tube and a supply unit can be changed according to other configurations inside a pulling furnace. The sample tube can be configured to move in a substantially horizontal direction or in a vertical direction with respect to a supply unit.

It should be noted that, in the above example, the sublimable dopant 23 is supplied to the melt 5 by a spraying method; however, the sublimable dopant 23 can be supplied to the melt 5 by a immersing method in which the supply unit 7 is immersed in the melt 5.

Figure 6:
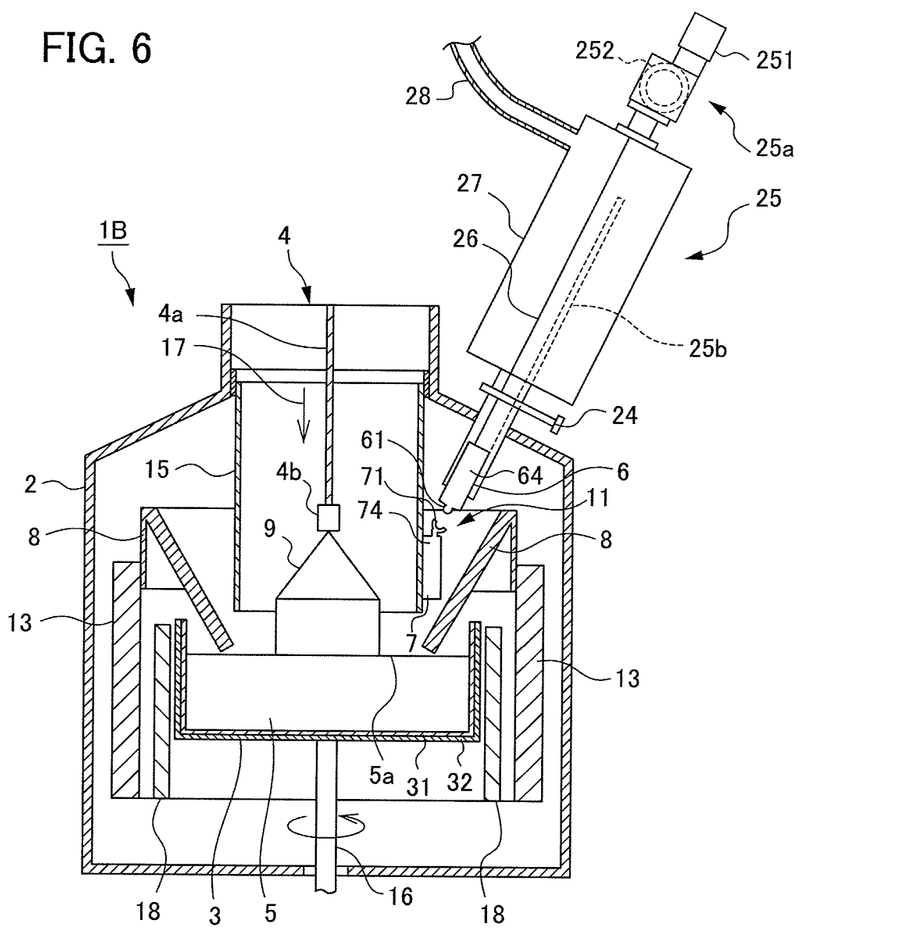
FIG. 6 is a schematic diagram illustrating a third example of the silicon single crystal pulling device used in the first or the second embodiment of the present invention.
Figure 7:
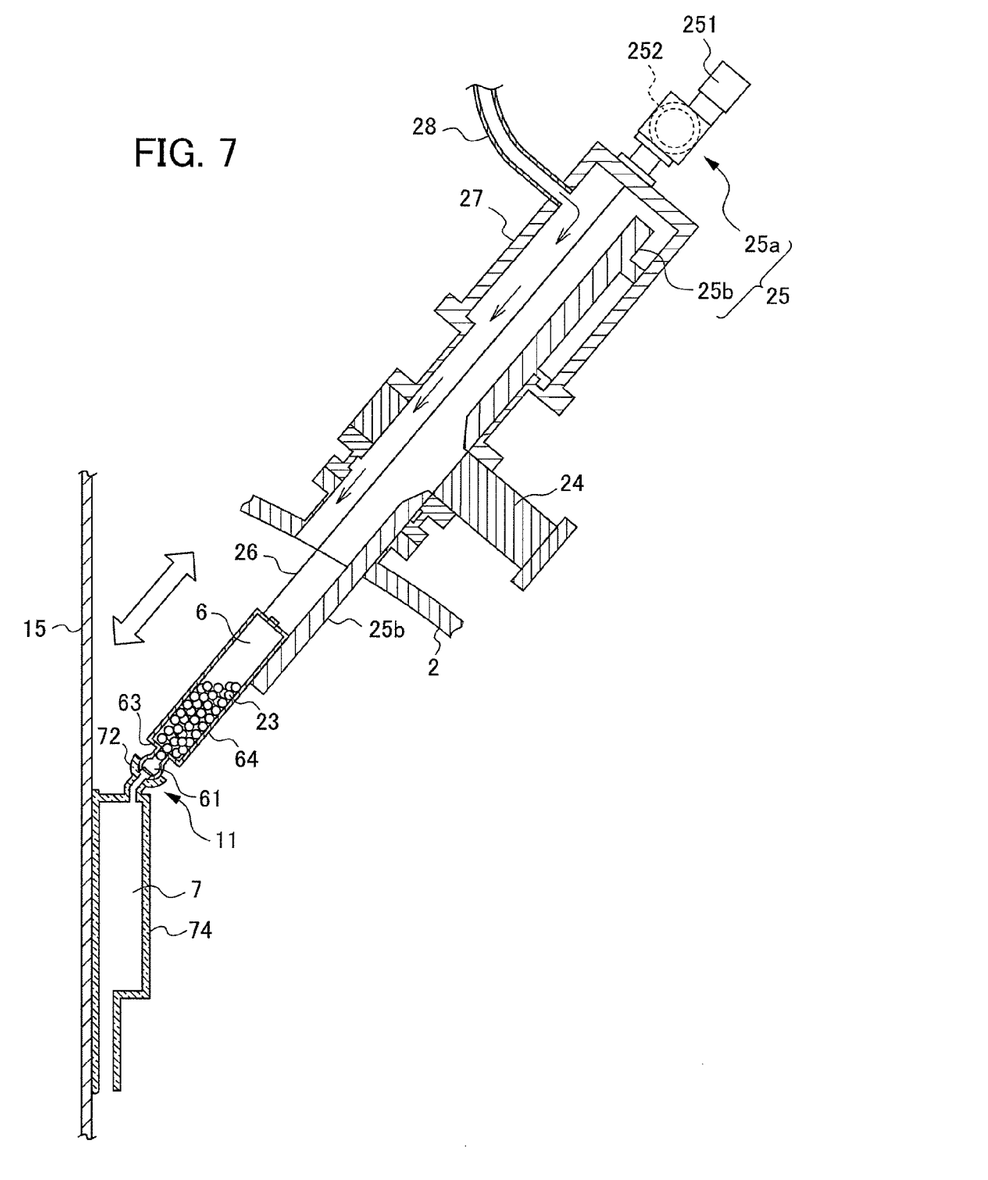
FIG. 7 is a partially-enlarged vertical sectional view of a state where a sample chamber with a gas supply unit and a sample tube according to the third example of the silicon single crystal pulling device are joined with a supply unit.

Third Example of Silicon Single Crystal Pulling Device Used in First or Second Embodiment of Present Invention Next, a third example of the silicon single crystal pulling device 1B used in the above embodiments is described in detail. FIG. 6 is a schematic diagram illustrating a third example of the silicon single crystal pulling device 1B used in the first or the second embodiment of the present invention. FIG. 7 is a partial vertical sectional view of the silicon single crystal pulling device 1B showing a state where the sample chamber 27 with a gas supply unit 28 and the sample tube 6 are joined with the supply unit 7. As shown in FIG. 6, the silicon single crystal pulling device 1B includes a pulling furnace (chamber) 2, a crucible 3, a heater 18, a heat insulating mould 13, a flow tube 15, a pulling mechanism 4, a sample chamber 27, a gas supply unit 28, a sample tube 6, a supply unit 7, a joining means 11, and a heat insulation member 8. It should be noted that, in the following description, similar parts to those in the abovementioned silicon single crystal pulling device 1 or 1A are designated by the same reference numerals and descriptions thereof may possibly be omitted.

The silicon single crystal pulling device 1B is characterized by the gas supply unit 28 being connected to the sample chamber 27. The gas supply unit 28 supplies cooling gas to the sample chamber 27 that cools an outer surface of the sample tube 6 inside the sample chamber 27.

As shown in FIG. 7, the gas supply unit 28 is connected to the sample chamber 27 on a side to the wire mechanism 25a (upper side). The gas supply unit 28 can supply cooling gas to an outer surface of the sample tube 6 disposed inside the pulling furnace 2 via the inside of the sample chamber 27, for cooling the outer surface of the sample tube 6. The gas supply unit 28 is composed of piping. The piping is branched from other piping (not shown) positioned above the sample chamber 27. Argon gas supplied to the pulling furnace 2 circulates in the other piping. The argon gas circulates also in the gas supply unit 28 that is branched from the other piping. The gas supply unit 28 thus can supply the argon gas to the sample chamber 27 as the cooling gas.

A temperature of the cooling gas supplied into the sample chamber 27 is 20 to 30° C. and preferably 22.5 to 27.5° C., from a viewpoint of optimizing a sublimation rate of the sublimable dopant 23.

The supply rate of the cooling gas into the sample chamber 27 is 3 to 10 L/min, and preferably 3 to 5 L/min. The supply rate of the cooling gas within the abovementioned range can allow the cooling gas to be appropriately blown onto the outer surface of the sample tube 6. In addition, the supply rate of the cooling gas within the abovementioned range does not seriously affect the surface 5a of the melt 5 by spraying the cooling gas onto the outer surface of the sample tube 6.

As in the silicon single crystal pulling devices 1 and 1A already described, the shielding means 24 is opened when doping of the silicon single crystal 9 with the sublimable dopant 23 is started, i.e. when the shoulder portion and a first half of the straight body portion of the silicon single crystal 9 have grown. Here, to open the shielding means 24, the sublimable dopant 23 is stored at a predetermined position in the sample chamber 27, a door of the sample chamber 27 is closed, and a pressure inside the pulling furnace 2 and a pressure inside the sample chamber 27 are adjusted by operating a vacuum pump on the sample chamber 27 side, and then the shielding means 24 is opened.

When the sample tube 6 guided by the guide rail 25b enters the pulling furnace 2, a part of the radiant heat from the surface 5a of the melt 5 to the silicon single crystal 9 is applied to a melt side end (lower end) of the sample tube 6. In addition, a part of the radiant heat from the heat insulation member 8 is also applied to the lower end of the sample tube 6. The argon gas supplied from the gas supply unit 28 via the inside of the sample chamber 27 is blown on an upper side of the outer surface of the sample tube 6. Even when the sublimable dopant 23 is vaporized by radiant heat in a lower side of the sample tube 6, the cooling gas supplied from the upper side of the sample tube 6 can prevent a sharp rise in temperature at the upper side thereof. Consequently, a vaporization rate of the sublimable dopant 23 within the sample tube 6 is lowered.

Thereafter, the sublimable dopant 23 is supplied from the supply unit 7, being blown onto the melt 5. A supply rate of the sublimable dopant 23 to the melt 5 is defined per minute per 1 kg of the remaining melt 5 at the beginning of supply of the sublimable dopant 23 to the melt 5. The supply rate is, as described in the first embodiment, 0.01 to 0.035 g/min·kg.

By using the silicon single crystal pulling device 1B, the following effect is achieved.

In the silicon single crystal pulling device 1B, the gas supplying unit 28 is connected to the sample chamber 27 and can supply cooling gas for cooling an outer surface of the sample tube 6 to the outer surface of the sample tube 6 disposed inside the pulling furnace 2 via the inside of the sample chamber 27. As a result, even when the sublimable dopant 23 is vaporized by radiant heat in a lower side of the sample tube 6, the cooling gas supplied from the upper side of the sample tube 6 can prevent a sharp rise in temperature at the upper side thereof. A vaporization rate of the sublimable dopant 23 can be thus lowered.

In addition, by adjusting a flow rate of gas supplied from the gas supply unit 28 into the sample chamber 27, a vaporization rate of the sublimable dopant 23 can be adjusted according to a temperature of radiant heat and an amount of the sublimable dopant 23 stored in the sample tube 6.

Furthermore, the cooling gas is supplied into the inside of the sample chamber 27 and then blown onto the sample tube 6 via the sample chamber 27. This can inhibit a rise in temperature of the cooling gas due to mixing with the atmosphere inside the pulling furnace 2. Therefore, the cooling gas can be sprayed onto the sample tube 6 at a desired temperature as in supplying thereof into the sample chamber 27.

In addition, the silicon single crystal pulling device 1B is configured such that the sample chamber 27 is externally attached to the pulling furnace 2 and the sample tube 6 is ascendable and descendable between the inside of the sample chamber 27 and the inside of the pulling furnace 2. In such a configuration, the sublimable dopant 23, when being stored in the sample chamber 27, is not affected by radiant heat from the melt 5 and the like inside the pulling furnace 2. Consequently, a timing of vaporization of the sublimable dopant 23 can be adjusted by positioning the sample tube 6 either in the sample chamber 27 or in the pulling furnace 2.

The silicon single crystal pulling device 1B is described above with a specific example; however, the silicon single crystal pulling device 1B is not limited thereto.

In the above example, the sample chamber 27 is externally attached to the pulling furnace 2; however, the sample chamber 27 can be attached within the pulling furnace 2.

For example, by providing a guide rail that extends from the inside of a sample chamber which is inside of a pulling furnace toward a melt outside the sample chamber, and a slide gate valve between the sample chamber and an atmosphere inside the pulling furnace, the sample tube can be configured to be moved up and down along the guide rail by a wire mechanism.

It should be noted that, in the above example, the sublimable dopant 23 is supplied to the melt 5 by a spraying method; however, the sublimable dopant 23 can be supplied to the melt 5 by an immersing method in which the supply unit 7 is immersed in the melt 5.

EXAMPLES

The present invention is described in further detail hereinafter by way of examples; however, the present invention is not limited thereto.

One hundred kilograms of polycrystalline silicon as a raw material was put into a crucible and a melt was obtained, and 800 g of arsenic as a dopant was added thereto and then a silicon single crystal was pulled by the CZ method. Next, after pulling a shoulder portion of the silicon single crystal, i.e. while pulling a straight body portion, 40 g of arsenic as an additional dopant was added to the melt, as a dopant addition step. Addition of the dopant was performed by subliming the dopant stored in a sample tube by way of radiant heat from the melt, and blowing vapor thus obtained onto the melt. In the following Examples 1 to 3 and Comparative Examples 1 and 2, the addition rate of the dopant to the melt (a sublimation rate of the dopant) was adjusted by changing a distance between the sample tube and a surface of the melt. The addition rate of the dopant (the sublimation rate of the dopant) was obtained by measuring a time period from the beginning of the dopant addition step to disappearance of 40 g of dopant stored in the sample tube due to sublimation.

Manufacturing conditions for silicon single crystals of Examples 1 to 3 and Comparative Examples 1 and 2 are shown in Table 1. "Remaining Melt" in Table 1 is a mass (kg) of the melt in a crucible at the beginning of the dopant addition step.

The presence of dislocation in the silicon single crystals thus obtained was evaluated. Evaluation of the presence of dislocation was performed by observing crystal habit lines on a surface of the silicon single crystals. The crystal habit lines on a surface of a silicon single crystal disappear if the silicon single crystal is dislocated. Therefore, a silicon single crystal with crystal habit lines that continue without disappearing can be evaluated to be dislocation-free, and a silicon single crystal with crystal habit lines that disappear in mid-course can be evaluated to be dislocated. Evaluation results are shown in Table 1.

TABLE 1

| | Addition Rate of Dopant(DP) (g/min) | Remaining Melt (kg) | Addition Rate of DP per 1 kg of Melt (g/min · kg) | State of Single Crystal |
|---|---|---|---|---|
| Example 1 | 1.3 | 88.1 | 0.014 | Dislocation Free |
| Example 2 | 1.7 | 85.0 | 0.020 | Dislocation Free |
| Example 3 | 2.9 | 81.8 | 0.035 | Dislocation Free |
| Comparative Example 1 | 3.6 | 89.2 | 0.040 | Dislocated |
| Comparative Example 2 | 5.0 | 66.9 | 0.075 | Dislocated |

As shown in Table 1, silicon single crystals of Examples 1 to 3, in which an addition rate of the dopant per 1 kg of the melt in the crucible, at the beginning of the dopant addition step, was 0.01 to 0.035 g/min·kg, were not dislocated due to an addition of the additional dopant. On the contrary, silicon single crystals of Comparative Examples 1 and 2, in which an addition rate of the dopant was not within the abovementioned range, were dislocated according to an addition of the additional dopant. From the above result, it can be understood that, according to the present invention, introduction of dislocation into a silicon single crystal can be reduced even in a case where a required amount of dopant is added to a melt while growing a straight body portion of a silicon single crystal. This allows manufacture of a silicon single crystal of low resistivity including a large amount of dopant without dislocation.

What is claimed is:

1. A manufacturing method for a silicon single crystal comprising:
    a growth step of growing the silicon single crystal by dipping a seed crystal into a melt of silicon and then pulling the seed crystal therefrom; and
    a dopant addition step included in the growth step, adding a dopant to the melt while a straight body portion of the silicon single crystal is growing; wherein
    in the dopant addition step, a remaining mass of the melt is calculated at the beginning of the dopant addition step, and the dopant is added to the melt at a rate of 0.01 to 0.035 g/min·kg, wherein the rate corresponds to the remaining mass of the melt thus calculated.

2. A manufacturing method for a silicon single crystal comprising:
a growth step of growing the silicon single crystal by dipping a seed crystal into a silicon melt and then pulling the seed crystal therefrom; and
a dopant addition step included in the growth step, adding a dopant to the melt while a straight body portion of the silicon single crystal is growing; wherein
in the dopant addition step, a decreasing rate of resistivity of the silicon single crystal due to addition of the dopant is in a range of 2 to 8% per 10 mm in a growing direction thereof.

3. The manufacturing method for a silicon single crystal according to claim 1,
wherein the dopant added in the dopant addition step is a sublimable dopant; and
in the dopant addition step, the dopant is supplied to the melt by blowing a sublimed dopant onto the melt.

4. The manufacturing method for a silicon single crystal according to claim 1,
wherein the dopant added in the dopant addition step is arsenic.

5. The manufacturing method for a silicon single crystal according to claim 1,
wherein an addition rate of the dopant to the melt is adjusted by adjusting an amount of radiant heat from a heat source to inside of a sample tube containing the dopant.

6. The manufacturing method for a silicon single crystal according to claim 5,
wherein the amount of radiant heat is adjusted by composing the sample tube of opaque quartz.

7. The manufacturing method for a silicon single crystal according to claim 5,
wherein the amount of radiant heat is adjusted by providing a heat insulation material between the sample tube and the heat source.

8. The manufacturing method for a silicon single crystal according to claim 1, using a silicon single crystal pulling device to pull a doped silicon single crystal from the melt by the Czochralski method, the device comprising:
a pulling furnace;
a vertically long sample tube that is provided inside or outside the pulling furnace and accommodates a sublimable dopant to be supplied to the melt inside; and
a supply unit that is provided inside the pulling furnace, joined with the sample tube, and supplies the sublimable dopant supplied from the sample tube to the melt,
wherein the sample tube has an area S at one end on a melt-side of inside thereof that is no greater than 7 cm$^2$.

9. The manufacturing method for a silicon single crystal according to claim 8,
wherein a proportion of the area S (cm$^2$) to a length L (cm) in a longitudinal direction of the sample tube (L/S) is no less than 2.0 (1/cm).

10. The manufacturing method for a silicon single crystal according to claim 8,
wherein the sample tube is composed of opaque quartz.

11. The manufacturing method for a silicon single crystal according to claim 8,
wherein a heat insulation material is provided with the sample tube on the melt-side thereof.

12. The manufacturing method for a silicon single crystal according to claim 8, the device further comprising a sample chamber that is externally attached to the pulling furnace and accommodates the sample tube inside,
wherein the sample tube can move up and down between inside of the sample chamber and inside of the pulling furnace.

13. The manufacturing method for a silicon single crystal according to claim 1, using a silicon single crystal pulling device that pulls a doped silicon single crystal from the melt by the Czochralski method, the device comprising:
a pulling furnace;
a sample chamber that is provided inside or outside the pulling furnace;
a sample tube that is provided in the sample chamber, that accommodates a sublimable dopant inside to be supplied to the melt and can move between inside and outside of the sample chamber;
a supply unit that is provided inside the pulling furnace, joined with the sample tube, and supplies the sublimable dopant supplied from the sample tube to the melt; and
a gas supplying unit that is connected to the sample chamber and can supply cooling gas for cooling an outer surface of the sample tube to the outer surface of the sample tube disposed inside the pulling furnace via inside of the sample chamber.

14. The manufacturing method for a silicon single crystal according to claim 13,
wherein a temperature of the cooling gas supplied to the inside of the sample chamber is 20 to 30° C.

15. The manufacturing method for a silicon single crystal according to claim 13,
wherein the cooling gas is supplied to the inside of the sample chamber at a rate of 3 to 10 L/min.

16. The manufacturing method for a silicon single crystal according to claim 13,
wherein the sample chamber is externally attached to the pulling furnace, and
the sample tube can move up and down between the inside of the sample chamber and the inside of the pulling furnace.

17. The manufacturing method for a silicon single crystal according to claim 2,
wherein the dopant added in the dopant addition step is a sublimable dopant; and
in the dopant addition step, the dopant is supplied to the melt by blowing a sublimed dopant onto the melt.

18. The manufacturing method for a silicon single crystal according to claim 2,
wherein the dopant added in the dopant addition step is arsenic.

19. The manufacturing method for a silicon single crystal according to claim 2,
wherein an addition rate of the dopant to the melt is adjusted by adjusting an amount of radiant heat from a heat source to inside of a sample tube containing the dopant.

20. The manufacturing method for a silicon single crystal according to claim 19,
wherein the amount of radiant heat is adjusted by composing the sample tube of opaque quartz.

21. The manufacturing method for a silicon single crystal according to claim 19,
wherein the amount of radiant heat is adjusted by providing a heat insulation material between the sample tube and the heat source.

22. The manufacturing method for a silicon single crystal according to claim 2, using a silicon single crystal pulling device that pulls a doped silicon single crystal from a melt by Czochralski method, the device comprising:

a pulling furnace;
a vertically long sample tube that is provided inside or outside the pulling furnace and accommodates a sublimable dopant to be supplied to the melt inside; and
a supply unit that is provided inside the pulling furnace, joined with the sample tube, and supplies the sublimable dopant supplied from the sample tube to the melt,
wherein the sample tube has an area S at one end on a melt-side of inside thereof that is no greater than 7 cm$^2$.

23. The manufacturing method for a silicon single crystal according to claim 22,
wherein a proportion of the area S (cm$^2$) to a length L (cm) in a longitudinal direction of the sample tube (L/S) is no less than 2.0 (1/cm).

24. The manufacturing method for a silicon single crystal according to claim 22,
wherein the sample tube is composed of opaque quartz.

25. The manufacturing method for a silicon single crystal according to claim 22,
wherein a heat insulation material is provided with the sample tube on a melt-side thereof.

26. The manufacturing method for a silicon single crystal according to claim 22, the device further comprising a sample chamber that is externally attached to the pulling furnace and accommodates the sample tube inside,
wherein the sample tube can move up and down between inside of the sample chamber and inside of the pulling furnace.

27. The manufacturing method for a silicon single crystal according to claim 2, using a silicon single crystal pulling device that pulls a doped silicon single crystal from a melt by the Czochralski method, the silicon single crystal device comprising:
a pulling furnace;
a sample chamber that is provided inside or outside the pulling furnace;
a sample tube that is provided in the sample chamber, accommodates a sublimable dopant to be supplied to the melt inside and can move between inside and outside of the sample chamber;
a supply unit that is provided inside the pulling furnace, joined with the sample tube, and supplies the sublimable dopant supplied from the sample tube to the melt; and
a gas supplying unit that is connected to the sample chamber and can supply cooling gas for cooling an outer surface of the sample tube to the outer surface of the sample tube disposed inside the pulling furnace via inside of the sample chamber.

28. The manufacturing method for a silicon single crystal according to claim 27,
wherein a temperature of the cooling gas supplied to the inside of the sample chamber is 20 to 30° C.

29. The manufacturing method for a silicon single crystal according to claim 27,
wherein the cooling gas is supplied to the inside of the sample chamber at a rate of 3 to 10 L/min.

30. The manufacturing method for a silicon single crystal according to claim 27,
wherein the sample chamber is externally attached to the pulling furnace, and
the sample tube can move up and down between the inside of the sample chamber and the inside of the pulling furnace.

* * * * *